US012592273B2

(12) United States Patent

Lu

(10) Patent No.: US 12,592,273 B2

(45) Date of Patent: Mar. 31, 2026

(54) USAGE-BASED DISTURBANCE MITIGATION

(71) Applicant: Micron Technology, Inc., Boise, ID (US)

(72) Inventor: Yang Lu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 120 days.

(21) Appl. No.: 18/624,920

(22) Filed: Apr. 2, 2024

(65) Prior Publication Data

US 2024/0347098 A1    Oct. 17, 2024

Related U.S. Application Data

(60) Provisional application No. 63/495,719, filed on Apr. 12, 2023.

(51) Int. Cl.
*G11C 11/406* (2006.01)
*G11C 11/4093* (2006.01)

(52) U.S. Cl.
CPC .. *G11C 11/40618* (2013.01); *G11C 11/40615* (2013.01); *G11C 11/4093* (2013.01)

(58) Field of Classification Search
CPC ..................... G11C 11/40615; G11C 11/4093
See application file for complete search history.

(56) References Cited

U.S. PATENT DOCUMENTS

| | | | | |
|---|---|---|---|---|
| 11,386,946 | B2 * | 7/2022 | Ayyapureddi | ........ G11C 11/406 |
| 2016/0211008 | A1 * | 7/2016 | Benedict | ............... G06F 11/076 |
| 2021/0350844 | A1 * | 11/2021 | Morohashi | ........ G11C 11/40611 |
| 2023/0215484 | A1 * | 7/2023 | Jung | ................... G11C 11/4087 |
| | | | | 365/222 |

* cited by examiner

*Primary Examiner* — Min Huang
(74) *Attorney, Agent, or Firm* — Colby Nipper PLLC

(57) ABSTRACT

Apparatuses and techniques for implementing usage-based disturbance mitigation are described. In some examples, a Total Mitigation Pump Pair (TMPP) queue and a dynamic Mitigation Threshold (MT) can improve the mitigation efficiency of usage-based disturbances while reducing power requirements and increasing performance impact. In various aspects, the TMPP queue is a first-in first out (FIFO) queue useful to implement the described disturbance mitigation techniques.

20 Claims, 9 Drawing Sheets

200

100

Apparatus
102

Host Device
104

Processor
110

Cache Memory
112

Memory Controller
114

116 — Interconnect
106

Memory Device
108

Mitigation FIFO Queue
and Controller
118

Mitigation Threshold
Calculator
120

102-1
IoT 102-2

102-3

102-4

102-5

102-6

102-7

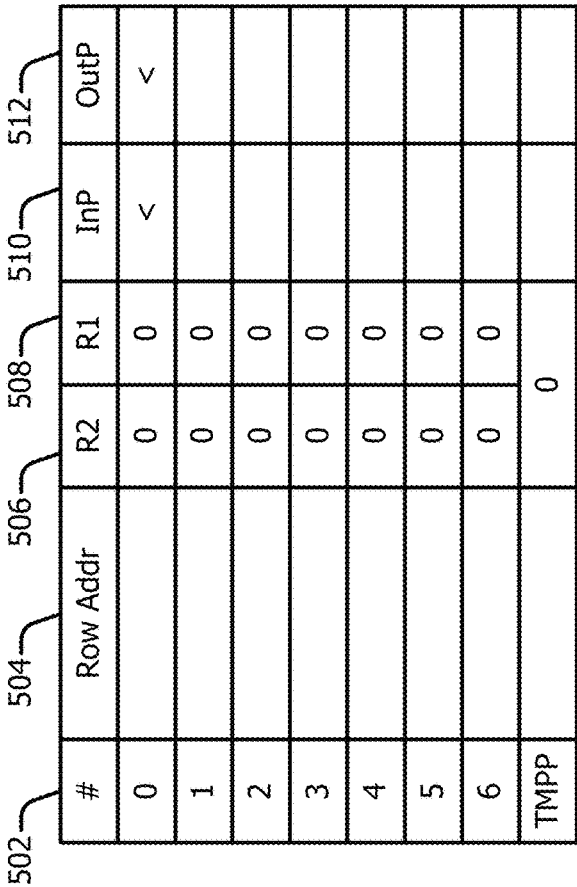
| # | Row Addr | R2 | R1 | InP | OutP |
|---|----------|----|----|-----|------|
| 0 | | 0 | 0 | v | v |
| 1 | | 0 | 0 | | |
| 2 | | 0 | 0 | | |
| 3 | | 0 | 0 | | |
| 4 | | 0 | 0 | | |
| 5 | | 0 | 0 | | |
| 6 | | 0 | 0 | | |
| TMPP | | 0 | | | |
502 504 506 508 510 512
500
*FIG. 5*

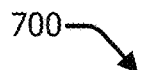

700

Calculate a Mitigation Threshold (MT) Value
702

Store Data Associated with Usage-Based Disturbances in a
Mitigation Queue Having Multiple Slots Associated with
Aggressor Row Addresses
704

Update the Mitigation Queue Based on Received Aggressor
Row Addresses
706

Set Multiple Bits Representing Whether Victim Rows Adjacent
to (or Near) an Aggressor Row need to be Mitigated
708

Calculate a Total Mitigation Pump Pair (TMPP) Value in the
Mitigation Queue Based on the Multiple Bit Settings
710

Generate an Alert when All Slots in the Mitigation Queue are
Occupied by an Aggressor Row Address
712

*FIG. 7*

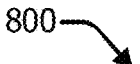
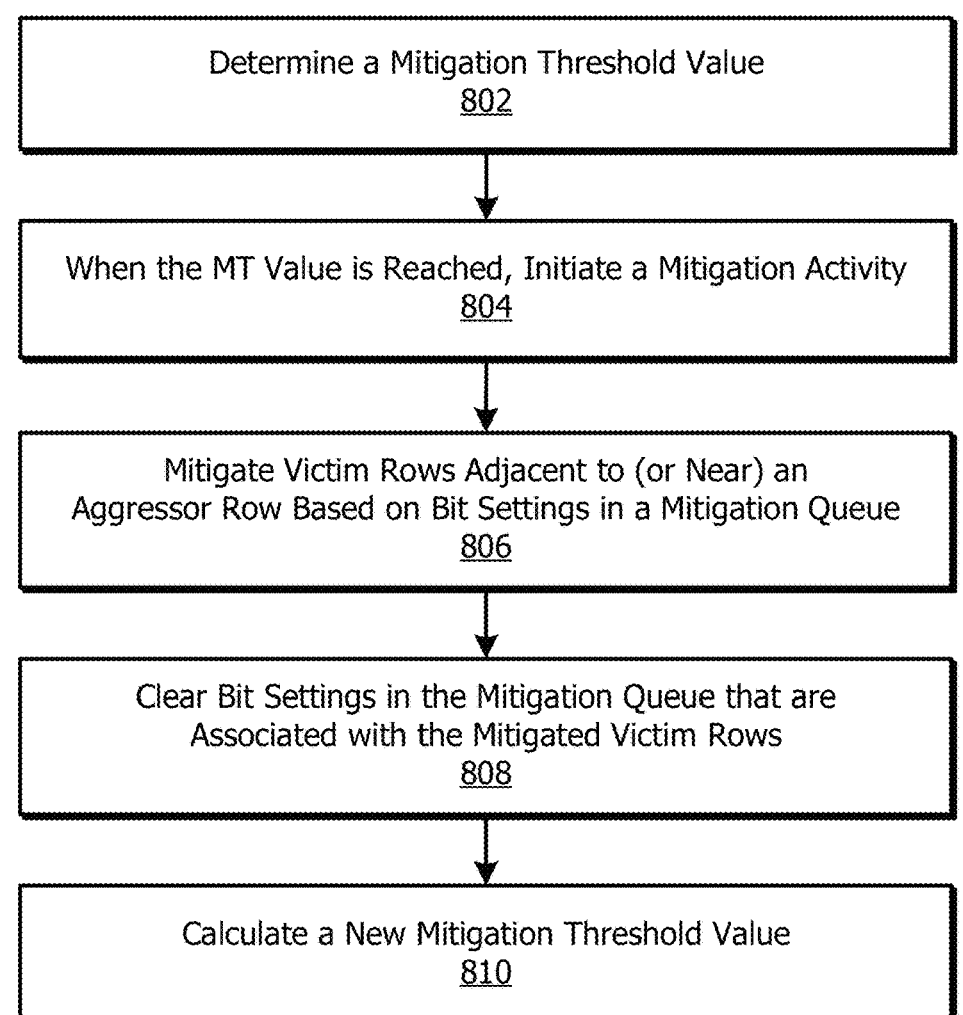
800
Determine a Mitigation Threshold Value
802
When the MT Value is Reached, Initiate a Mitigation Activity
804
Mitigate Victim Rows Adjacent to (or Near) an
Aggressor Row Based on Bit Settings in a Mitigation Queue
806
Clear Bit Settings in the Mitigation Queue that are
Associated with the Mitigated Victim Rows
808
Calculate a New Mitigation Threshold Value
810
*FIG. 8*

USAGE-BASED DISTURBANCE MITIGATION

CROSS-REFERENCE TO RELATED APPLICATION(S)

This application claims the benefit of U.S. Provisional Patent Application Ser. No. 63/495,719 filed on Apr. 12, 2023, the disclosure of which is incorporated by reference herein in its entirety.

BACKGROUND

Computers, smartphones, and other electronic devices rely on processors and memories. A processor executes code based on data to run applications and provide features to a user. The processor obtains the code and the data from a memory. The memory in an electronic device can include volatile memory (e.g., random-access memory (RAM)) and non-volatile memory (e.g., flash memory). Like the capabilities of a processor, the capabilities of a memory can impact the performance of an electronic device. This performance impact can increase as processors are developed that execute code faster and as applications operate on increasingly larger data sets that require ever-larger memories.

BRIEF DESCRIPTION OF THE DRAWINGS

Apparatuses of and techniques for implementing usage-based disturbance mitigation are described with reference to the following drawings. The same numbers are used throughout the drawings to reference like features and components:

FIG. 5 illustrates an example First-In, First-Out (FIFO) queue structure that can implement aspects of usage-based disturbance mitigation;

FIG. 7 illustrates an example method for implementing aspects of usage-based disturbance mitigation; and FIG. 8 illustrates an example method for implementing aspects of usage-based disturbance mitigation.

DETAILED DESCRIPTION

Overview

Figure 1:
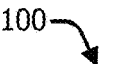
FIG. 1 illustrates example apparatuses that can implement aspects of usage-based disturbance mitigation.

Processors and memory work in tandem to provide features to users of computers and other electronic devices. As processors and memory operate more quickly together in a complementary manner, an electronic device can provide enhanced features, such as high-resolution graphics and artificial intelligence (AI) analysis. Some applications, such as those for financial services, medical devices, and advanced driver assistance systems (ADAS), can also demand more-reliable memories. These applications use increasingly reliable memories to limit errors in financial transactions, medical decisions, and object identification. However, in some implementations, more-reliable memories can sacrifice bit densities, power efficiency, and simplicity.

To meet the demands for physically smaller memories, memory devices can be designed with higher chip densities. Increasing chip density, however, can increase the electromagnetic coupling (e.g., capacitive coupling) between adjacent or proximate rows of memory cells due, at least in part, to a shrinking distance between these rows. With this undesired coupling, activation (or charging) of a first row of memory cells can sometimes negatively impact a second nearby row of memory cells. In particular, activation of the first row can generate interference, or crosstalk, that causes the second row to experience a voltage fluctuation. In some instances, this voltage fluctuation can cause a state (or value) of a memory cell in the second row to be incorrectly determined by a sense amplifier. Consider an example in which a state of a memory cell in the second row is a "1". In this example, the voltage fluctuation can cause a sense amplifier to incorrectly determine the state of the memory cell to be a "0" instead of a "1". Left unchecked, this interference can lead to memory errors or data loss within the memory device.

In some circumstances, a particular row of memory cells is activated repeatedly in an unintentional or intentional (sometimes malicious) manner. Consider, for instance, that memory cells in an $R^{th}$ row are subjected to repeated activation, which causes one or more memory cells in an adjacent row (e.g., within an R+1 row, an R+2 row, an R−1 row, and/or an R−2 row) to change states. This effect is referred to as a usage-based disturbance. The occurrence of usage-based disturbance can lead to the corruption or changing of contents within the affected row of memory. In some examples, a threshold value may be set that triggers mitigation of the usage-based disturbance. In one example, the threshold value may be in the range of 500-1000 usage-based disturbances. In other examples, any threshold value (or range of values) may be set to trigger mitigation of the usage-based disturbance.

Some memory devices utilize circuits that can detect usage-based disturbance and mitigate its effects. These circuits, however, can add complexity and cost to a memory device. Additionally, these circuits can increase an overall footprint and power consumption of the memory device, which can make it challenging to integrate within space-constrained devices, including portable devices.

To address this and other issues regarding usage-based disturbance, this document describes aspects of usage-based disturbance mitigation. As described herein, a Total Mitigation Pump Pair (TMPP) FIFO queue and a dynamic Mitigation Threshold (MT) can improve the mitigation efficiency of usage-based disturbances, while reducing power requirements and increasing performance impact. Although particular examples discussed herein refer to a FIFO queue, alternate embodiments may be implemented using any type of queue.

Example Operating Environments

FIG. 1 illustrates, at 100 generally, an example operating environment including an apparatus 102 that can implement usage-based disturbance mitigation. The apparatus 102 can include various types of electronic devices, including an internet-of-things (IoT) device 102-1, tablet device 102-2, smartphone 102-3, notebook computer 102-4, passenger vehicle 102-5, server computer 102-6, and server cluster 102-7 that may be part of cloud computing infrastructure, a data center, or a portion thereof (e.g., a printed circuit board (PCB)). Other examples of the apparatus 102 include a wearable device (e.g., a smartwatch or intelligent glasses), entertainment device (e.g., a set-top box, video dongle, smart television, gaming device), desktop computer, motherboard, server blade, consumer appliance, vehicle, drone, industrial equipment, security device, sensor, or the electronic components thereof. Each type of apparatus can include one or more components to provide computing functionalities or features.

In example implementations, the apparatus 102 can include at least one host device 104, at least one interconnect 106, and at least one memory device 108. The host device 104 can include at least one processor 110, at least one cache memory 112, and a memory controller 114. The memory device 108, which can also be realized with a memory module, can include, for example, a dynamic random-access memory (DRAM) die or module (e.g., Low-Power Double Data Rate synchronous DRAM (LPDDR SDRAM)). The DRAM die or module can include a three-dimensional (3D) stacked DRAM device, which may be a high-bandwidth memory (HBM) device or a hybrid memory cube (HMC) device. The memory device 108 can operate as a main memory for the apparatus 102. Although not illustrated, the apparatus 102 can also include storage memory. The storage memory can include, for example, a storage-class memory device (e.g., a flash memory, hard disk drive, solid-state drive, phase-change memory (PCM), or memory employing 3D XPoint™).

The processor 110 is operatively coupled to the cache memory 112, which is operatively coupled to the memory controller 114. The processor 110 is also coupled, directly or indirectly, to the memory controller 114. The host device 104 may include other components to form, for instance, a system-on-a-chip (SoC). The processor 110 may include a general-purpose processor, central processing unit, graphics processing unit (GPU), neural network engine or accelerator, application-specific integrated circuit (ASIC), field-programmable gate array (FPGA) integrated circuit (IC), or communications processor (e.g., a modem or baseband processor).

In operation, the memory controller 114 can provide a high-level or logical interface between the processor 110 and at least one memory (e.g., an external memory). The memory controller 114 may be realized with any of a variety of suitable memory controllers (e.g., a double-data-rate (DDR) memory controller that can process requests for data stored on the memory device 108). Although not shown, the host device 104 may include a physical interface (PHY) that transfers data between the memory controller 114 and the memory device 108 through the interconnect 106. For example, the physical interface may be an interface that is compatible with a DDR PHY Interface (DFI) Group interface protocol. The memory controller 114 can, for example, receive memory requests from the processor 110 and provide the memory requests to external memory with appropriate formatting, timing, and reordering. The memory controller 114 can also forward to the processor 110 responses to the memory requests received from the external memory.

The host device 104 is operatively coupled, via the interconnect 106, to the memory device 108. In some examples, the memory device 108 is connected to the host device 104 via the interconnect 106 with an intervening buffer or cache. The memory device 108 may operatively couple to storage memory (not shown). The host device 104 can also be coupled, directly or indirectly via the interconnect 106, to the memory device 108 and the storage memory.

The interconnect 106 and other interconnects (not illustrated in FIG. 1) can transfer data between two or more components of the apparatus 102. Examples of the interconnect 106 include a bus (e.g., a unidirectional or bidirectional bus), switching fabric, or one or more wires that carry voltage or current signals. The interconnect 106 can propagate one or more communications 116 between the host device 104 and the memory device 108. For example, the host device 104 may transmit a memory request to the memory device 108 over the interconnect 106. Also, the memory device 108 may transmit a corresponding memory response to the host device 104 over the interconnect 106.

The illustrated components of the apparatus 102 represent an example architecture with a hierarchical memory system. A hierarchical memory system may include memories at different levels, with each level having memory with a different speed or capacity. As illustrated, the cache memory 112 logically couples the processor 110 to the memory device 108. In the illustrated implementation, the cache memory 112 is at a higher level than the memory device 108. A storage memory, in turn, can be at a lower level than the main memory (e.g., the memory device 108). Memory at lower hierarchical levels may have a decreased speed but increased capacity relative to memory at higher hierarchical levels.

The apparatus 102 can be implemented in various manners with more, fewer, or different components. For example, the host device 104 may include multiple cache memories (e.g., including multiple levels of cache memory) or no cache memory. In other implementations, the host device 104 may omit the processor 110 or the memory controller 114. A memory (e.g., the memory device 108) may have an "internal" or "local" cache memory. As another example, the apparatus 102 may include cache memory between the interconnect 106 and the memory device 108. Computer engineers can also include any of the illustrated components in distributed or shared memory systems.

Computer engineers may implement the host device 104 and the various memories in multiple manners. In some cases, the host device 104 and the memory device 108 can be disposed on, or physically supported by, a printed circuit board (e.g., a rigid or flexible motherboard). The host device 104 and the memory device 108 may additionally be integrated together on an integrated circuit or fabricated on separate integrated circuits and packaged together. The memory device 108 may also be coupled to multiple host devices 104 via one or more interconnects 106 and may respond to memory requests from two or more host devices 104. Each host device 104 may include a respective memory controller 114, or the multiple host devices 104 may share a memory controller 114. This document describes with reference to FIG. 1 an example computing system architecture having at least one host device 104 coupled to a memory device 108.

Two or more memory components (e.g., modules, dies, banks, or bank groups) can share the electrical paths or couplings of the interconnect 106. The interconnect 106 can include at least one command-and-address bus (CA bus) and at least one data bus (DQ bus). The command-and-address bus can transmit addresses and commands from the memory controller 114 of the host device 104 to the memory device 108, which may exclude propagation of data. The data bus can propagate data between the memory controller 114 and the memory device 108. The memory device 108 may also be implemented as any suitable memory including, but not limited to, DRAM, SDRAM, three-dimensional (3D)

stacked DRAM, DDR memory, or LPDDR memory (e.g., LPDDR DRAM or LPDDR SDRAM).

The memory device 108 can form at least part of the main memory of the apparatus 102. The memory device 108 may, however, form at least part of a cache memory, a storage memory, or a system-on-chip of the apparatus 102. The memory device 108 includes a mitigation First-In, First-Out (FIFO) queue and controller 118 (or FIFO-QC 118), which includes a mitigation threshold calculator 120.

The mitigation FIFO-QC 118 manages operation of a TMPP FIFO queue to mitigate usage-based disturbances. As discussed herein, the mitigation FIFO-QC 118 manages the TMPP FIFO queue to monitor aggressor rows and required pump pairs to determine when to perform usage-based disturbance mitigation. A "pump" refers to an action of activating a word line (WL) on or off. A pump may also be referred to as a "mitigation pump." A pump may refer to a single WL or multiple WLs at the same time. As discussed herein, a "pump pair" refers to two pumps that mitigate a pair of victim rows associated with one aggressor row, such as +1 and −1, or +2 and −2. Since the pair of victim rows are on both sides of the aggressor row, the described systems and methods will use two pumps to mitigate the two victim rows individually. To remove one aggressor row address from the TMPP FIFO queue, the mitigation FIFO-QC 118 mitigates all victim rows associated with the aggressor row. If mitigation is needed for rows +1 and −1, then one pump pair is used to mitigate two victim rows. If mitigation is needed for rows +1, −1, +2, and −2, then two pump pairs are used to mitigate all four victim rows.

The mitigation threshold calculator 120 calculates a dynamic MT used by the TMPP FIFO queue. As discussed herein, the dynamic MT is calculated based on the status of the TMPP FIFO queue. The mitigation FIFO-QC 118 and the mitigation threshold calculator 120 are further described with respect to FIG. 2.

Figure 2:
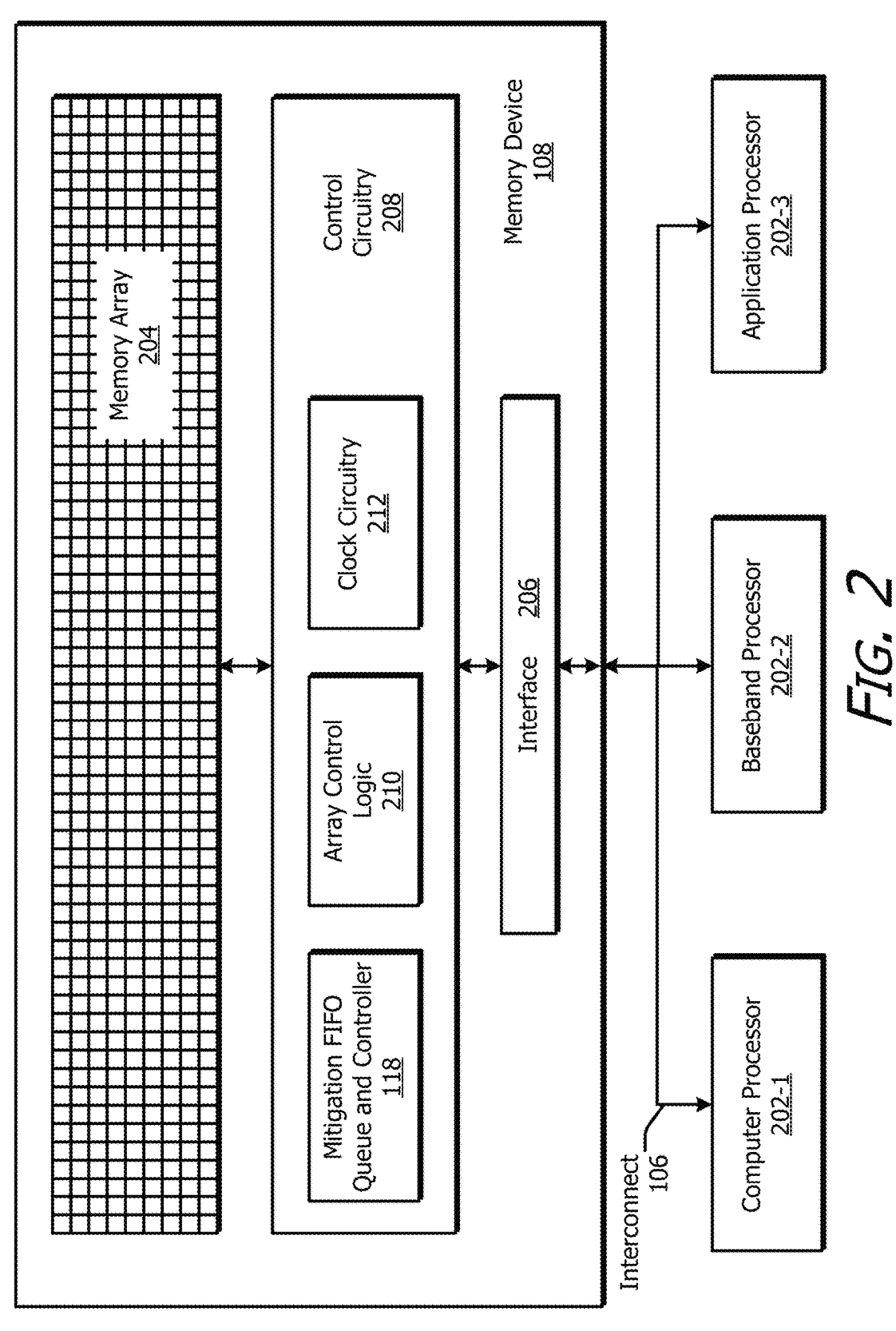
FIG. 2 illustrates an example computing system that can implement aspects of usage-based disturbance mitigation within a memory device.

FIG. 2 illustrates an example computing system 200 that can implement aspects of usage-based disturbance mitigation. In some implementations, the computing system 200 includes at least one memory device 108, at least one interconnect 106, and at least one processor 202. The memory device 108 can include, or be associated with, at least one memory array 204, at least one interface 206, and control circuitry 208 (or periphery circuitry) operatively coupled to the memory array 204. The memory array 204 can include an array of memory cells, including but not limited to memory cells of DRAM, SDRAM, three-dimensional (3D) stacked DRAM, DDR memory, LPDDR SDRAM, and so forth. The memory array 204 and the control circuitry 208 may be components on a single semiconductor die or on separate semiconductor dies. The memory array 204 or the control circuitry 208 may also be distributed across multiple dies. This control circuitry 208 may manage traffic on a bus that is separate from the interconnect 106.

The control circuitry 208 can include various components that the memory device 108 can use to perform various operations. These operations can include communicating with other devices, managing memory performance, performing refresh operations (e.g., self-refresh operations or auto-refresh operations), and performing memory read or write operations. For example, the control circuitry 208 can include at least one instance of array control logic 210, clock circuitry 212, and mitigation FIFO-QC 118. The array control logic 210 can include circuitry that provides command decoding, address decoding, input/output functions, amplification circuitry, power supply management, power control modes, and other functions. The clock circuitry 212 can synchronize various memory components with one or more external clock signals provided over the interconnect 106, including a command-and-address clock or a data clock. The clock circuitry 212 can also use an internal clock signal to synchronize memory components and may provide timer functionality.

The mitigation FIFO-QC 118 manages the operation of a TMPP FIFO queue to mitigate usage-based disturbances. For example, the mitigation FIFO-QC 118 may reduce the impact of usage-based disturbances in computing system 200 by clearing rows that are victims of the usage-based disturbances. In some examples, the mitigation FIFO-QC 118 works in combination with the dynamic MT generated by the mitigation threshold calculator 120.

The interface 206 can couple the control circuitry 208 or the memory array 204 directly or indirectly to the interconnect 106. In some implementations, the mitigation FIFO-QC 118, the array control logic 210, and the clock circuitry 212 can be part of a single component (e.g., the control circuitry 208). In other implementations, one or more of the mitigation FIFO-QC 118, the array control logic 210, or the clock circuitry 212 may be implemented as separate components, which can be provided on a single semiconductor die or disposed across multiple semiconductor dies. These components may individually or jointly couple to the interconnect 106 via the interface 206.

The interconnect 106 may use one or more of a variety of interconnects that communicatively couple together various components and enable commands, addresses, or other information and data to be transferred between two or more components (e.g., between the memory device 108 and the processor 202). Although the interconnect 106 is illustrated with a single line in FIG. 2, the interconnect 106 may include at least one bus, at least one switching fabric, one or more wires or traces that carry voltage or current signals, at least one switch, one or more buffers, and so forth. Further, the interconnect 106 may be separated into at least a command-and-address bus and a data bus.

In some aspects, the memory device 108 may be a "separate" component relative to the host device 104 (of FIG. 1) or any of the processors 202. The separate components can include a printed circuit board, memory card, memory stick, and memory module (e.g., a single in-line memory module (SIMM) or dual in-line memory module (DIMM)). Thus, separate physical components may be located together within the same housing of an electronic device or may be distributed over a server rack, a data center, and so forth. Alternatively, the memory device 108 may be integrated with other physical components, including the host device 104 or the processor 202, by being combined on a printed circuit board or in a single package or a system-on-chip.

As shown in FIG. 2, the processors 202 may include a computer processor 202-1, a baseband processor 202-2, and an application processor 202-3, coupled to the memory device 108 through the interconnect 106. The processors 202 may include or form a part of a central processing unit, graphics processing unit, system-on-chip, application-specific integrated circuit, or field-programmable gate array. In some cases, a single processor can comprise multiple processing resources, each dedicated to different functions (e.g., modem management, applications, graphics, central processing). In some implementations, the baseband processor 202-2 may include or be coupled to a modem (not illustrated in FIG. 2) and referred to as a modem processor. The modem or the baseband processor 202-2 may be coupled wirelessly to a network via, for example, cellular, Wi-Fi®, Bluetooth®, near field, or another technology or protocol for wireless communication.

In some implementations, the processors 202 may be connected directly to the memory device 108 (e.g., via the row interconnect 106). In other implementations, one or more of the processors 202 may be indirectly connected to the memory device 108 (e.g., over a network connection or through one or more other devices).

Example Techniques and Hardware

Figure 3:
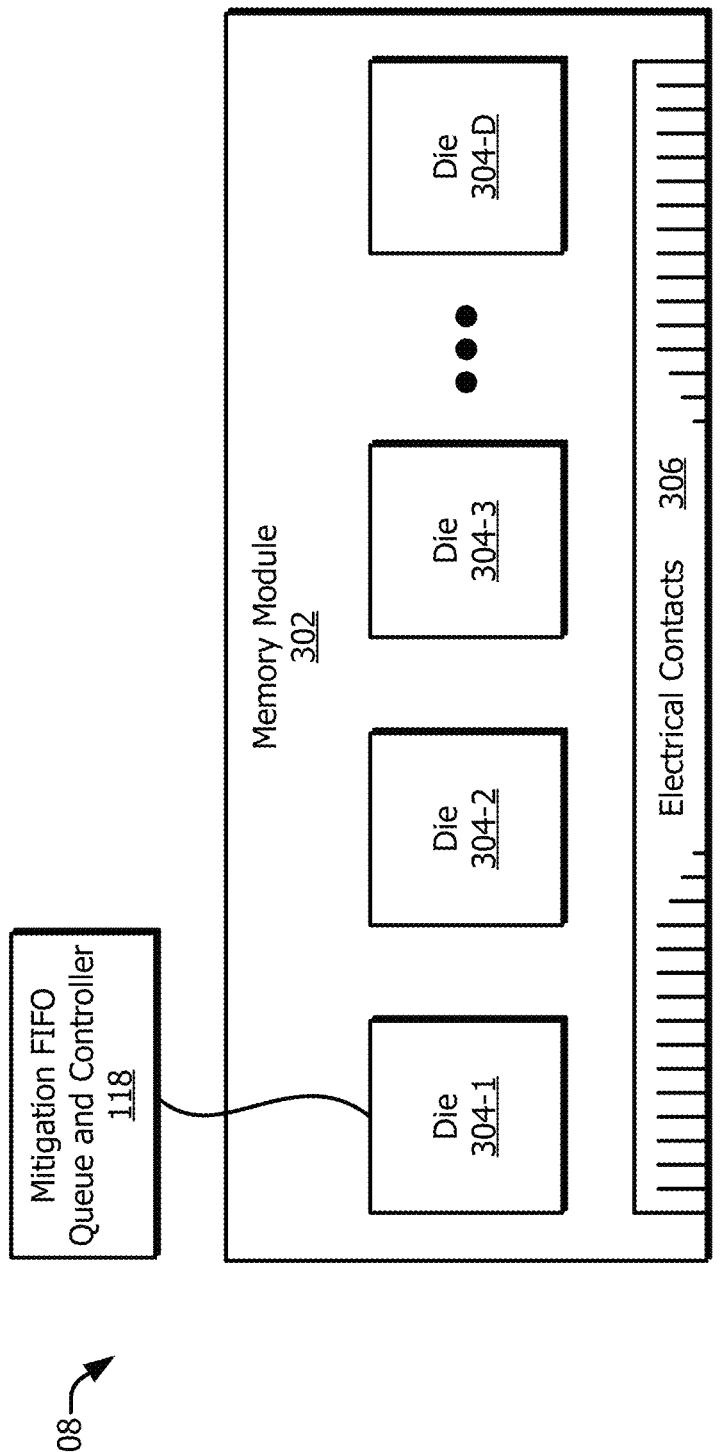
FIG. 3 illustrates an example memory device in which aspects of usage-based disturbance mitigation may be implemented.

FIG. 3 illustrates an example memory device 108 in which aspects of usage-based disturbance mitigation can be implemented. The memory device 108 includes a memory module 302, which can include multiple dies 304. As illustrated, the memory module 302 includes a first die 304-1, a second die 304-2, a third die 304-3, and a Dth die 304-D, with D representing a positive integer. One or more of the dies 304-1 to 304-D can include the mitigation FIFO-QC 118. The memory module 302 can be a SIMM or a DIMM. As another example, the memory module 302 can interface with other components via a bus interconnect (e.g., a Peripheral Component Interconnect Express (PCIe®) bus). The memory device 108 illustrated in FIGS. 1 and 2 can correspond, for example, to multiple dies (or dice) 304-1 through 304-D, or the memory module 302 with two or more dies 304. As shown, the memory module 302 can include one or more electrical contacts 306 (e.g., pins) to interface the memory module 302 to other components.

The memory module 302 can be implemented in various manners. For example, the memory module 302 may include a printed circuit board, and the multiple dies 304-1 through 304-D may be mounted or otherwise attached to the printed circuit board. The dies 304 (e.g., memory dies) may be arranged in a line or along two or more dimensions (e.g., forming a grid or array). The dies 304 may have a similar size or may have different sizes. Each die 304 may be similar to another die 304 or different in size, shape, data capacity, or control circuitries. The dies 304 may also be positioned on a single side or on multiple sides of the memory module 302. Example components of the mitigation FIFO-QC 118 are further described with respect to FIG. 4.

Figure 4:
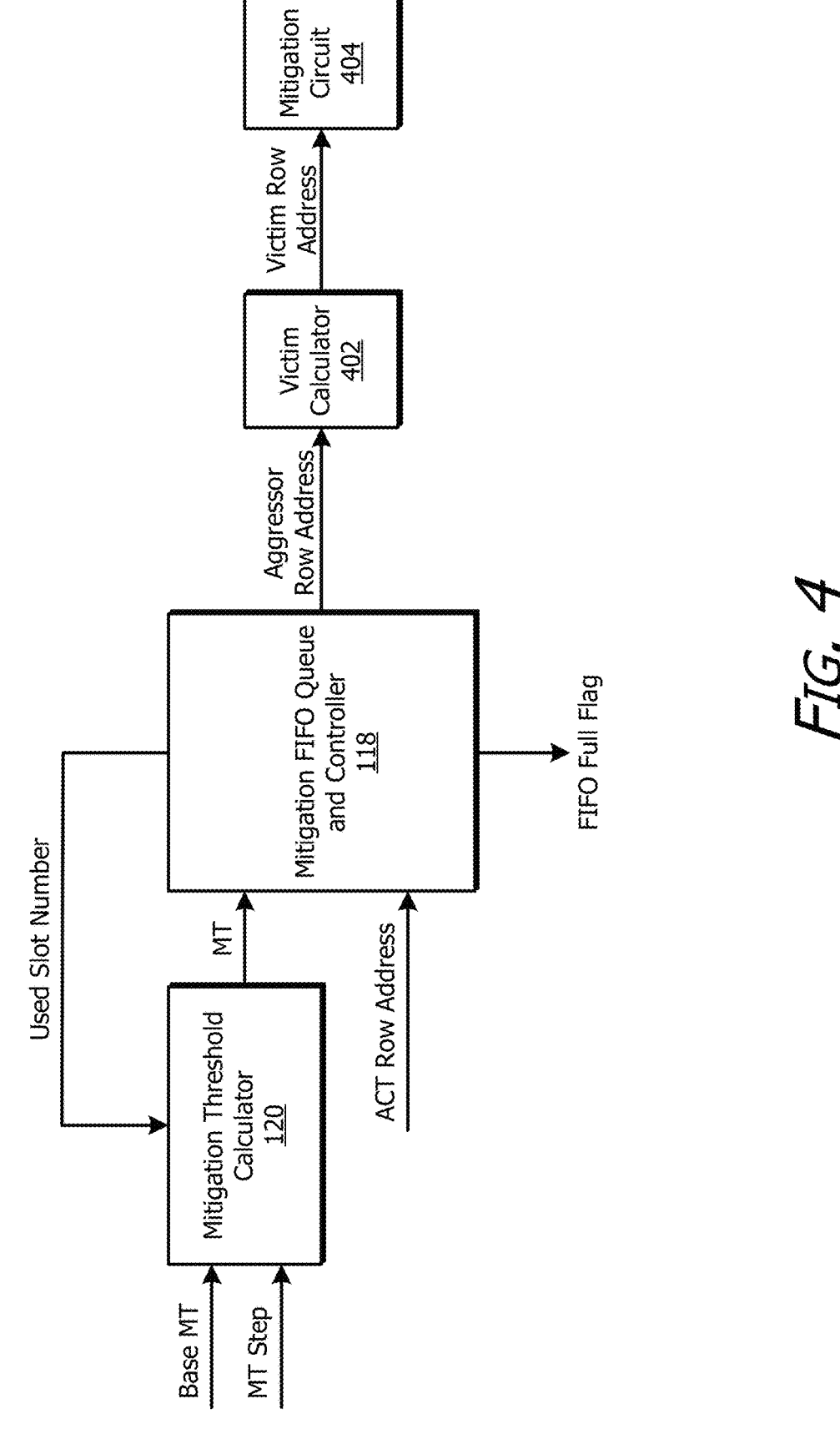
FIG. 4 illustrates an example system that can implement aspects of usage-based disturbance mitigation.

FIG. 4 illustrates an example system 400 that can implement aspects of usage-based disturbance mitigation. In some implementations, the system 400 includes the mitigation FIFO-QC 118, the mitigation threshold calculator 120, a victim calculator 402, and a mitigation circuit 404. As illustrated, the mitigation threshold calculator 120 receives a Base MT (Mitigation Threshold) and an MT Step. The Base MT represents an initial MT that is used in calculating a dynamic MT, as discussed herein. In some situations, the Base MT is associated with an empty FIFO queue. The MT Step represents a change in the MT. In some examples, the Base MT and MT Step values are determined by designers based on expected results related to power, die size, performance, and the like. The mitigation threshold calculator 120 generates an MT and communicates the MT to the mitigation FIFO-QC 118.

The mitigation FIFO-QC 118 also receives an Activation Command (ACT) Row Address. The ACT Row Address identifies a row address of a current WL. Based on the MT and the ACT Row Address, the mitigation FIFO-QC 118 performs usage-based disturbance mitigation as described herein.

As shown in FIG. 4, the mitigation FIFO-QC 118 may generate a FIFO queue Full Flag in certain situations, as described herein. Additionally, the mitigation FIFO-QC 118 provides Used Slot Number information to the mitigation threshold calculator 120. The Used Slot Number information includes data regarding slots used in the TMPP FIFO queue. The mitigation FIFO-QC 118 also provides an Aggressor Row Address to the victim calculator 402, which uses the Aggressor Row Address to calculate victim row addresses, such as +1, −1, +2, and −2. The victim calculator 402 provides one or more Victim Row Addresses to the mitigation circuit 404, which uses the Victim Row Addresses to mitigate the Victim Row Addresses by turning each victim WL on and off. Turning each victim WL on and off may be facilitated by an on/off circuit.

FIG. 5 illustrates an example TMPP FIFO queue structure 500 that can implement aspects of usage-based disturbance mitigation. For example, the TMPP FIFO queue structure 500 can be used by the mitigation FIFO-QC 118, as discussed herein. In some implementations, the TMPP FIFO queue structure 500 includes a slot number column 502, a row address column 504, an R2 (row +2 and row −2) column 506, an R1 (row +1 and row −1) column 508, an In Pointer (InP) column 510, and an Out Pointer (OutP) column 512.

As illustrated in FIG. 5, the TMPP FIFO queue structure 500 is empty (e.g., the FIFO queue is not storing any data). The slot number column 502 identifies seven slots in this example. The row address column 504 stores one or more aggressor row addresses that have been identified. As discussed herein, an aggressor row is a particular row of memory cells that is activated repeatedly. The R2 column 506 identifies rows needing pump pairs that are +2 rows away from the aggressor row and −2 rows away from the aggressor row. A 0 in a particular entry of the R2 column 506 indicates that pump pairs are not needed for the +2 and −2 rows. A 1 in a particular entry of the R2 column 506 indicates that pump pairs are needed for the +2 and −2 rows.

Similarly, the R1 column 508 identifies rows needing pump pairs that are +1 row away from the aggressor row and −1 row away from the aggressor row. A 0 bit in a particular entry of the R1 column 508 indicates that pump pairs are not needed for the +1 and −1 rows. A 1 bit in a particular entry of the R1 column 508 indicates that pump pairs are needed for the +1 and −1 rows. The R1 and R2 values for a particular slot are reset to 0 after a mitigation activity is completed for the particular aggressor row. As used herein, the R1 and R2 column entries may be referred to as bits or flags.

In the examples described herein, the TMPP FIFO queue structure 500 includes the R1 column 508 and the R2 column 506. In other embodiments, any number of columns may be included to identify additional victim rows needing mitigation. For example, other embodiments may include an R3 column (row +3 and row −3), an R4 column (row +4 and row −4), and so forth. Additionally, some embodiments may include the R1 column 508 without the R2 column 506.

Since the TMPP FIFO queue structure 500 is empty, the InP and OutP pointers (shown in columns 510 and 512) both point to slot 0 as the next available FIFO queue slot. As data is entered into the TMPP FIFO queue structure 500, the InP and OutP pointers will be adjusted accordingly. The InP pointer identifies the next available FIFO queue slot. The OutP pointer identifies the next slot to be mitigated during the next mitigation activity. The OutP pointer moves to the next slot when the current slot's R1 and R2 values are both 0. The InP pointer moves to the next slot when at least one of the current slot's R1 or R2 values is 1.

A last row in the TMPP FIFO queue structure 500 stores the Total Mitigation Pump Pairs (TMPP) associated with the data in the TMPP FIFO queue. For example, the TMPP value in the last row of the TMPP FIFO queue structure 500 is a sum of all entries in the columns 506 and 508. This sum of all the entries represents the number of pump pairs needed (based on the current data in the FIFO queue) to mitigate one or more usage-based disturbances. A mitigation delay (MD) can be calculated in real time based on the TMPP value in the last row of the TMPP FIFO queue structure 500.

The dynamic MT can be used with the TMPP FIFO queue structure 500 discussed with respect to FIG. 5. As mentioned above, the dynamic MT changes over time based on the status or content of the TMPP FIFO queue structure 500. The dynamic MT method may also be referred to as "decreasing MT" because the MT value can decrease as the TMPP FIFO queue structure 500 is filled. The described systems and methods may determine an MT value based on the filled slot number in the TMPP FIFO queue structure 500. Generally, the MT value is lower as more TMPP FIFO queue slots are filled. The MT value will be highest when the TMPP FIFO queue is full because this situation triggers an alert that will stop FIFO queue activities. In this situation, there is minimal mitigation delay.

Another high MT value situation occurs when the TMPP FIFO queue structure 500 is empty because the mitigation delay of one of the FIFO queue's slots is considered. The Base MT and the MT Step can be adjusted using fuses, test modes, and other techniques as needed. During Array Counter Update (ACU) operation, if the R1 bits 508 or R2 bits 506 reach the MT, the current row address is added to the TMPP FIFO queue structure 500. As discussed herein, a pump pair refers to two pumps that mitigate a pair of victim rows associated with one aggressor row, such as +1 and −1, or +2 and −2. The pump pairs will mitigate each address in the TMPP FIFO queue structure 500. If the TMPP FIFO queue structure 500 is empty, then the pump pairs are not activated. If the TMPP FIFO queue structure 500 is nearly full or in overflow, the memory device will notify or interrupt the host for urgent mitigation (e.g., by issuing an alert). The system may stop memory activity on one or more memory banks until the alert is cleared.

The dynamic MT value discussed herein may start at a higher value when the TMPP FIFO queue structure 500 is empty. As the slots in the TMPP FIFO queue structure 500 are filled, the MT value may decrease since the filled FIFO queue slots require more pump pairs. The MT for R1 508 (FIG. 5) is calculated as follows:

$$MT_{R1} = DHL_{R1} - GAP_{R1} - F(TMPP + 1)/tRC$$

In the above equation, DHL is based on a process capability, GAP is calculated based on tREFI (refresh interval), "TMPP+1" is the mitigation delay after adding a new entry to the TMPP FIFO queue structure 500, and tRC is a bank cycle time. In the equation above, TMPP is the mitigation delay before adding the new entry to the TMPP FIFO queue structure 500. When the TMPP FIFO queue is empty, F (TMPP+1)=F(1), which is a 1 pump pair mitigation delay. $MT_{R1}$ is at its maximum value when the TMPP FIFO queue is empty. Generally, each used slot in the TMPP FIFO queue structure 500 reduces $MT_{R1}$ because it increases TMPP by 1 or 2 (except filling the last slot in the TMPP FIFO queue, which triggers an alert indicating that the TMPP FIFO queue is full). In some embodiments, the MT for R2 506 (FIG. 5) is calculated in a manner similar to that for $MT_{R1}$ discussed above.

Figure 6A:
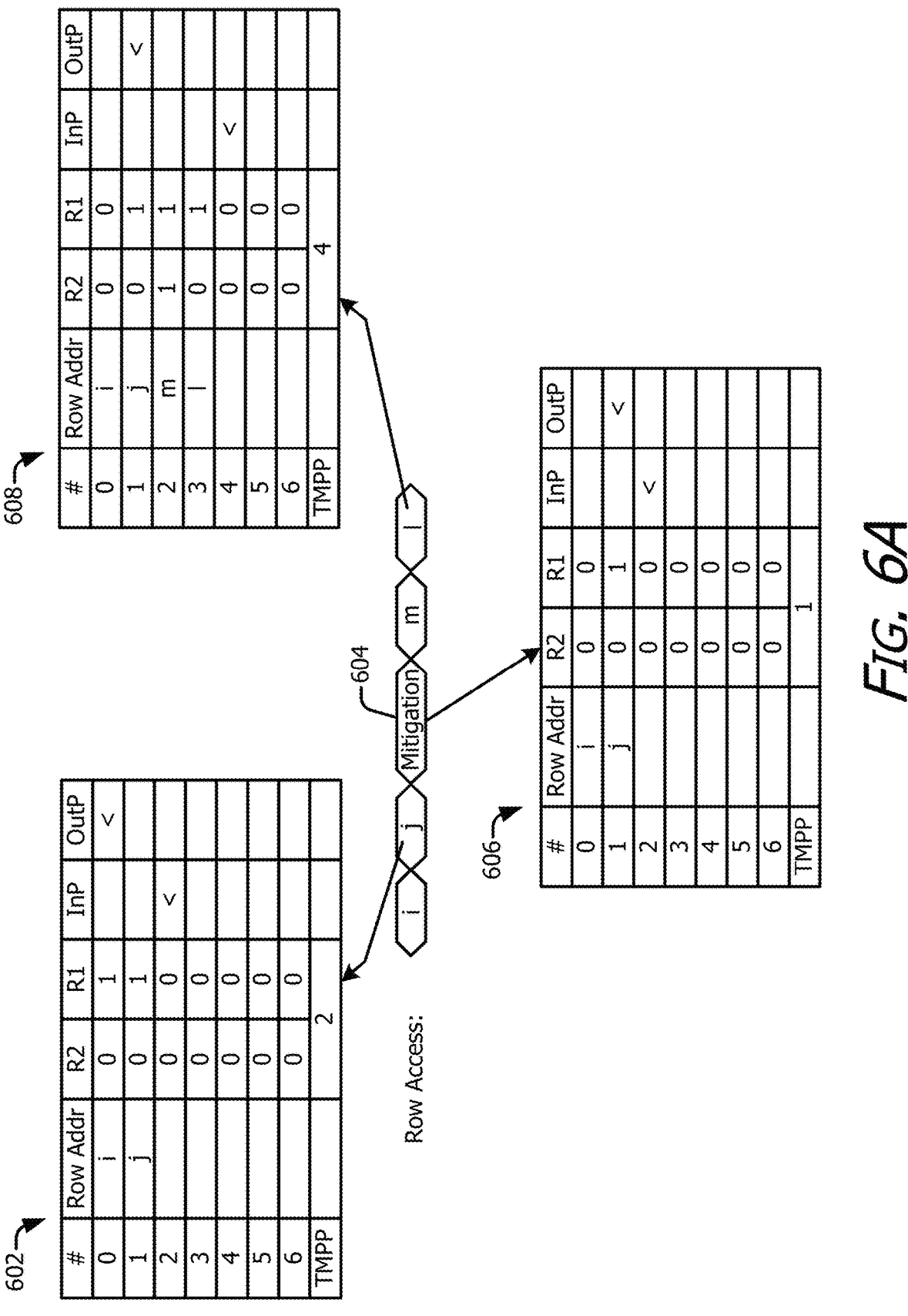
FIGS. 6A and 6B illustrate an example implementation of the usage-based disturbance mitigation systems and methods described herein.
Figure 6B:
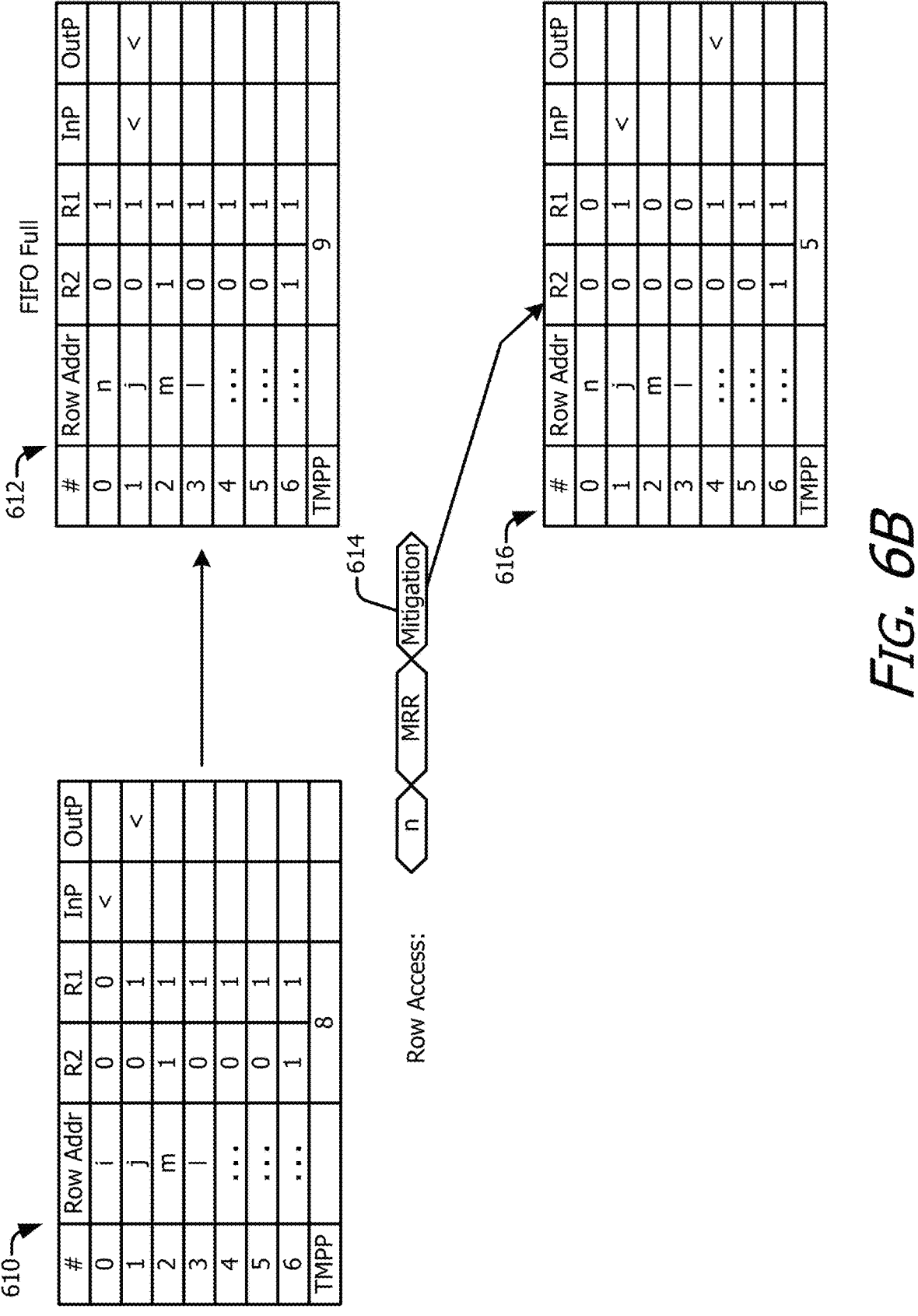

FIGS. 6A and 6B illustrate an example implementation of the usage-based disturbance mitigation systems and methods described herein. The TMPP FIFO queue configurations shown in FIGS. 6A and 6B correspond to the TMPP FIFO queue structure 500 discussed herein.

An initial TMPP FIFO queue configuration 602 shows slot 0 and slot 1 storing row addresses i and j, respectively. For both row addresses i and j, the R1 bits are set to 1 and the R2 bits are set to 0. Thus, one pump pair is required for each of the R1 bits (two pump pairs in total), but no pump pairs are required for the R2 bits. Thus, the TMPP value for the TMPP FIFO queue configuration 602 is two pump pairs. The InP points to slot 2, which will receive the next row address. The OutP points to slot 0, which is the row address to be cleared during the next mitigation activity.

The row access elements below TMPP FIFO queue configuration 602 illustrate row access activities (e.g., aggressor rows). As shown in FIG. 6A, a mitigation activity 604 is located in the row access elements. Performing the mitigation activity 604, changes the TMPP FIFO queue configuration as shown in 606. In particular, slot 0 is cleared, which causes the R1 bit for slot 0 to change to 0. Since slot 1 is not cleared, the R1 bit for slot 1 remains at 1. Thus, the TMPP value for the TMPP FIFO queue configuration 606 is 1. The InP still points to slot 2, which will receive the next row address. Since slot 0 is cleared by the mitigation activity 604, the OutP is changed to point to slot 1, which is the row address to be cleared during the next mitigation activity.

In some embodiments, the determination of when to perform a mitigation activity is based on the MT value. For example, a higher MT value may allow more rows in the TMPP FIFO queue to fill before performing a mitigation activity.

The row access elements show rows m and l following the mitigation activity 604. An updated TMPP FIFO queue configuration 608 is shown after receiving the row access elements for rows m and l. The TMPP FIFO queue configuration 608 shows row address m added to slot 2 and row address l added to slot 3. The TMPP FIFO queue configuration 608 shows both the R1 and R2 bits set to 1 for slot 2 (row m) and the R1 bit set to 1 for slot 3 (the R2 bit is set to 0 for slot 3). Since slot 1 is not cleared, the R1 bit for slot 1 remains at 1 and the R2 bit for slot 1 remains at 0. Thus, the TMPP value for the TMPP FIFO queue configuration 608 is 4. The In Pointer now points to slot 4, which will receive the next row address. The Out Pointer remains pointed to slot 1, which is the row address to be cleared during the next mitigation activity.

As shown in FIG. 6B, an updated TMPP FIFO queue configuration 610 has received row addresses for slots 4, 5, and 6. The TMPP FIFO queue configuration 610 shows the R1 bit set to 1 for slots 4, 5, and 6, while the R2 bit is set to 1 for slot 6. Thus, the TMPP value for the TMPP FIFO queue configuration 610 is 8. The In Pointer now points to slot 0, which will receive the next row address. The Out Pointer remains pointed to slot 1, which is the row address to be cleared during the next mitigation activity.

In the example of FIG. 6B, the next row address received is row n. An updated TMPP FIFO queue configuration 612 shows row n added to slot 0 and the R1 bit set to 1 for slot 0. The R2 bit is set to 0 for slot 0. Thus, the TMPP value for the TMPP FIFO queue configuration 612 is 9. The TMPP FIFO queue configuration 612 shows both the In Pointer and the Out Pointer pointing to slot 1. This indicates that the TMPP FIFO queue configuration 612 is full. Since the TMPP FIFO queue is full, an alert is generated to clear (or partially clear) the TMPP FIFO queue. As shown in FIG. 6B, a mitigation activity 614 is generated in the row access elements. "MRR" shown in FIG. 6B is a mode register read used to read status or configuration information from a memory device.

An updated TMPP FIFO queue configuration 616 shows the TMPP FIFO queue situation after the mitigation activity 614 is completed. For example, the mitigation activity 614 mitigates the aggressor row and victim rows for slots 0, 2, and 3. Thus, the R1 bits for slots 0, 2, and 3 are reset to 0. Similarly, the R2 bit for slot 2 is reset to 0. After completing mitigation activity 614, all the R1 and R2 bits are set to 0 for slots 0, 2, and 3. As illustrated in FIG. 6B, the TMPP value for the TMPP FIFO queue configuration 616 is 5. The In Pointer still points to slot 1, which will receive the next row address. The Out Pointer points to slot 4, which is the row address to be cleared during the next mitigation activity.

In some embodiments, the described systems and methods use a counter that decrements each time new pump pairs are needed to clear the TMPP FIFO queue. For example, the counter may start with a value of 1000 and is decremented by 50 for each pump pair needed to clear the TMPP FIFO queue. As shown in the TMPP FIFO queue configuration 602, the TMPP value is 2, so the counter would be decremented to 900 (subtracting 100 from 1000). In the TMPP FIFO queue configuration 612, the TMPP value is 9, so the counter would be decremented to 550 (subtracting 450 from 1000). In other examples, the counter may begin with any value and may be decremented by any amount for each pump pair needed to clear the TMPP FIFO queue.

Example Methods

This section describes example methods for implementing usage-based disturbance mitigation with reference to flow diagrams FIGS. 7 and 8. These descriptions may also refer to components, entities, and other aspects depicted in FIGS. 1 to 6B by way of example only. The described methods are not necessarily limited to performance by one entity or multiple entities operating on one device.

FIG. 7 illustrates a flow diagram 700, which includes operations 702 through 712. In some aspects, operations of the method 700 are implemented by or with the mitigation FIFO-QC 118 as described with reference to FIGS. 1 to 6B. At 702, a mitigation threshold (MT) value is calculated. For example, the mitigation threshold calculator 120 may calculate the MT at 702.

At 704, data associated with usage-based disturbances is stored in a mitigation queue having multiple slots associated with aggressor row addresses. For example, the mitigation queue may be the TMPP FIFO queue structure 500, as shown in FIG. 5.

At 706, the mitigation queue is updated based on one or more received aggressor row addresses. For example, the TMPP FIFO queue structure 500 may be updated as discussed with respect to FIGS. 5 to 6B.

At 708, multiple bits are set that represent whether victim rows adjacent to (or near) an aggressor row need to be mitigated. For example, the TMPP FIFO queue structure 500 shown in FIG. 5 may store the settings of these multiple bits. In aspects, a plurality of bits may be set in the mitigation queue that represent whether victim rows proximate an aggressor row need to be mitigated, such as based on the mitigation threshold and the plurality of bits.

At 710, a TMPP value in the mitigation queue is calculated based on the multiple bit settings discussed above. For example, the TMPP FIFO queue structure 500 shown in FIG. 5 may indicate the total number of pump pairs needed to mitigate all aggressor row addresses contained in the mitigation queue.

At 712, an alert is generated when all slots in the mitigation queue are occupied by an aggressor row address. For example, each slot in the TMPP FIFO queue structure 500 shown in FIG. 5 includes at least one aggressor row address that needs to be mitigated.

FIG. 8 illustrates a flow diagram 800, which includes operations 802 through 810. In some aspects, operations of the method 800 are implemented by or with the mitigation FIFO-QC 118 as described with reference to FIGS. 1 to 6B. At 802, a mitigation threshold value is determined. For example, the mitigation threshold calculator 120 may calculate the mitigation threshold value at 802 or the mitigation threshold value may be accessed from a storage location.

At 804, when the mitigation threshold is reached, a mitigation activity is initiated. For example, the mitigation activity may include activating and/or deactivating one or more rows (e.g., word lines) based on information in the TMPP FIFO queue structure 500 discussed herein. The mitigation activity may also be referred to as a usage-based disturbance mitigation. In some aspects, a mitigation controller may initiate mitigation activities or operations in response to or when one or more of the TMPP values of the TMPP FIFO exceed a mitigation threshold value calculated for a memory array, memory device, or the like.

At 806, victim rows adjacent to (or near) an aggressor row are mitigated based on bit settings in a mitigation queue. For example, the TMPP FIFO queue structure 500 may identify which victim rows need to be mitigated, as discussed with respect to FIGS. 5 to 6B.

At 808, certain bit settings in the mitigation queue are cleared, such as the bit settings associated with the victim rows mitigated at 806. As mentioned above, the TMPP FIFO queue structure 500 shown in FIG. 5 may store the settings of these multiple bits.

At 810, a new mitigation threshold value is calculated based on the results of the mitigation activities discussed above.

For the figures described above, the orders in which operations are shown and/or described are not intended to be construed as a limitation. Any number or combination of the described process operations can be combined or rearranged in any order to implement a given method or an alternative method. Operations may also be omitted from or added to the described methods. Further, described operations can be implemented in fully or partially overlapping manners.

Aspects of these methods may be implemented in, for example, hardware (e.g., fixed-logic circuitry or a processor in conjunction with a memory), firmware, software, or some combination thereof. The methods may be realized using one or more of the apparatuses or components shown in FIGS. 1 to 6B, the components of which may be further divided, combined, rearranged, and so on. The devices and components of these figures generally represent hardware, such as electronic devices, packaged modules, IC chips, or circuits; firmware or the actions thereof; software; or a combination thereof. Thus, these figures illustrate some of the many possible systems or apparatuses capable of implementing the described methods.

Computer-readable media includes both non-transitory computer storage media and communication media, including any medium that facilitates transfer of a computer program (e.g., an application) or data from one entity to another. Non-transitory computer storage media can be any available medium accessible by a computer, such as RAM, ROM, Flash, EEPROM, optical media, and magnetic media.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Also, as used herein, a phrase referring to "at least one of" a list of items refers to any combination of those items, including single members. For instance, "at least one of a, b, or c" can cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c, or any other ordering of a, b, and c). Further, items represented in the accompanying figures and terms discussed herein may be indicative of one or more items or terms, and thus reference may be made interchangeably to single or plural forms of the items and terms in this written description.

In the following, various examples for implementing aspects of usage-based disturbance mitigation are described:

Example 1: An apparatus comprising:
a memory device comprising:
a memory array comprising rows of memory cells;
a mitigation threshold calculator configured to calculate a mitigation threshold value; and
a mitigation queue configured to:
store data associated with usage-based disturbances of the memory device, the data associated with usage-based disturbances comprising aggressor row addresses and bits representing rows of the memory cells proximate each aggressor row that need mitigation;
calculate a total mitigation pump pair (TMPP) value in the mitigation queue based on the bits representing rows proximate each aggressor row that need mitigation; and
initiate usage-based disturbance mitigation for at least a portion of the rows of the memory cells when the TMPP value exceeds the mitigation threshold value.

Example 2: The apparatus of example 1 or any other example, wherein the mitigation queue is a First-In, First-Out (FIFO) queue with a plurality of slots, wherein each slot of the FIFO queue stores at least one aggressor row address and at least one bit that represents at least one row proximate the at least one aggressor row that needs mitigation.

Example 3: The apparatus of example 2 or any other example, wherein the FIFO queue includes an In Pointer that identifies a slot to store a next received aggressor row address and an Out Pointer that identifies a next row address to be cleared during a next mitigation activity.

Example 4: The apparatus of example 1 or any other example, wherein the bits representing rows proximate each aggressor row that need mitigation include:
a first bit value that represents a pair of victim rows that are adjacent to the aggressor row; and
a second bit value that represents a pair of victim rows that have at least one intervening row between the victim rows and the aggressor row.

Example 5: The apparatus of example 4 or any other example, wherein the first bit value indicates whether zero or one pump pair is required to mitigate the victim rows adjacent to the aggressor row, and wherein the second bit value indicates whether zero or one pump pair is required to mitigate the victim rows that have at least one intervening row between the aggressor row.

Example 6: The apparatus of example 1 or any other example, wherein the mitigation threshold value is a dynamic mitigation threshold value, and wherein the mitigation threshold calculator calculates the dynamic mitigation threshold value based on an estimated mitigation delay associated with adding a new entry to the mitigation queue.

Example 7: The apparatus of example 1 or any other example, wherein each aggressor row is identified as experiencing repeated activation that may impact operation of at least one proximate victim row.

Example 8: The apparatus of example 1 or any other example, wherein the mitigation queue generates an alert when a plurality of slots in the mitigation queue are occupied by addresses of aggressor rows.

Example 9: The apparatus of example 8 or any other example, wherein a mitigation activity is initiated by the mitigation queue responsive to the alert, wherein the mitigation activity includes mitigating at least a portion of the aggressor rows identified in the plurality of slots in the mitigation queue.

Example 10: A method comprising:
calculating, by a memory device, a mitigation threshold value;
storing, by a mitigation queue in the memory device, data associated with usage-based disturbances of the memory device;
updating the mitigation queue based on received aggressor row addresses; and
setting a plurality of bits in the mitigation queue representing whether victim rows proximate an aggressor row need to be mitigated based on at least the mitigation threshold and the plurality of bits.

Example 11: The method of example 10 or any other example, further comprising calculating a total mitigation pump pair (TMPP) value in the mitigation queue based on the plurality of bits representing whether victim rows proximate an aggressor row need to be mitigated.

Example 12: The method of example 10 or any other example, wherein the plurality of bits representing whether victim rows proximate an aggressor row need to be mitigated include:
a first bit value that represents a pair of victim rows that are adjacent to the aggressor row; and
a second bit value that represents a pair of victim rows that have at least one intervening row between the victim rows and the aggressor row.

Example 13: The method of example 12 or any other example, wherein the first bit value indicates whether zero or one pump pair is required to mitigate the victim rows adjacent to the aggressor row, and wherein the second bit value indicates whether zero or one pump pair is required to mitigate the victim rows that have at least one intervening row between the aggressor row.

Example 14: The method of example 10 or any other example, wherein the mitigation queue operates in a First-In, First-Out (FIFO) manner with a plurality of slots, wherein each slot in the FIFO queue stores at least one aggressor row address and at least on bit that represents at least one row proximate the at least one aggressor row that needs mitigation.

Example 15: The method of example 10 or any other example, further comprising:
generating an alert when a plurality of slots in the mitigation queue are occupied by aggressor row addresses; and
initiating a mitigation activity responsive to the alert, wherein the mitigation activity includes mitigating at least a portion of the aggressor rows identified in the plurality of slots in the mitigation queue.

Example 16: An apparatus comprising:

a mitigation threshold calculator configured to calculate a mitigation threshold value; and a mitigation controller configured to:

store data in a mitigation queue associated with usage-based disturbances of a memory device, the data associated with usage-based disturbances comprising aggressor row addresses and bits representing rows of the memory device proximate each aggressor row that need mitigation;

calculate a total mitigation pump pair (TMPP) value in a mitigation queue based on the bits representing rows proximate each aggressor row that need mitigation; and initiate usage-based disturbance mitigation for at least a portion of the rows of the memory device when the TMPP value exceeds the mitigation threshold value.

Example 17: The apparatus of example 16 or any other example, wherein the bits representing rows of the memory device proximate each aggressor row that need mitigation include:

a first bit value that represents a pair of victim rows that are adjacent to the aggressor row; and a second bit value that represents a pair of victim rows that have at least one intervening row between the victim rows and the aggressor row.

Example 18: The apparatus of example 17 or any other example, wherein the first bit value indicates whether zero or one pump pair is required to mitigate the victim rows adjacent to the aggressor row, and wherein the second bit value indicates whether zero or one pump pair is required to mitigate the victim rows that have at least one intervening row between the aggressor row.

Example 19: The apparatus of example 16 or any other example, wherein the mitigation threshold value is a dynamic mitigation threshold value, and wherein the mitigation threshold calculator calculates the dynamic mitigation threshold value based on an estimated mitigation delay associated with adding a new entry to the mitigation queue.

Example 20: The apparatus of example 16 or any other example, wherein the mitigation queue is a First-In, First-Out (FIFO) queue with a plurality of slots, and wherein each slot of the FIFO queue stores at least one aggressor row address and at least one bit that represents at least one row proximate the at least one aggressor row that needs mitigation.

CONCLUSION

Although aspects of implementing usage-based disturbance mitigation have been described in language specific to certain features and/or methods, the subject of the appended claims is not necessarily limited to the specific features or methods described. Rather, the specific features and methods are disclosed as a variety of example implementations of implementing usage-based disturbance mitigation.

What is claimed is:

1. An apparatus comprising:

a memory device comprising:

a memory array comprising rows of memory cells;

a mitigation threshold calculator configured to calculate a mitigation threshold value; and a mitigation queue configured to:

store data associated with usage-based disturbances of the memory device, the data associated with usage-based disturbances comprising aggressor row addresses and bits representing rows of the memory cells proximate each aggressor row that need mitigation;

calculate a total mitigation pump pair (TMPP) value in the mitigation queue based on the bits representing rows proximate each aggressor row that need mitigation; and initiate usage-based disturbance mitigation for at least a portion of the rows of the memory cells when the TMPP value exceeds the mitigation threshold value.

2. The apparatus of claim 1, wherein the mitigation queue is a First-In, First-Out (FIFO) queue with a plurality of slots, wherein each slot of the FIFO queue stores at least one aggressor row address and at least one bit that represents at least one row proximate the at least one aggressor row that needs mitigation.

3. The apparatus of claim 2, wherein the FIFO queue includes an In Pointer that identifies a slot to store a next received aggressor row address and an Out Pointer that identifies a next row address to be cleared during a next mitigation activity.

4. The apparatus of claim 1, wherein the bits representing rows proximate each aggressor row that need mitigation include:

a first bit value that represents a pair of victim rows that are adjacent to the aggressor row; and a second bit value that represents a pair of victim rows that have at least one intervening row between the victim rows and the aggressor row.

5. The apparatus of claim 4, wherein the first bit value indicates whether zero or one pump pair is required to mitigate the pair of victim rows adjacent to the aggressor row, and wherein the second bit value indicates whether zero or one pump pair is required to mitigate the pair of victim rows that have at least one intervening row between the pair of victim rows and the aggressor row.

6. The apparatus of claim 1, wherein the mitigation threshold value is a dynamic mitigation threshold value, and wherein the mitigation threshold calculator calculates the dynamic mitigation threshold value based on an estimated mitigation delay associated with adding a new entry to the mitigation queue.

7. The apparatus of claim 1, wherein each aggressor row is identified as experiencing repeated activation that may impact operation of at least one proximate victim row.

8. The apparatus of claim 1, wherein the mitigation queue generates an alert when a plurality of slots in the mitigation queue are occupied by addresses of aggressor rows.

9. The apparatus of claim 8, wherein a mitigation activity is initiated by the mitigation queue responsive to the alert, wherein the mitigation activity includes mitigating at least a portion of the aggressor rows identified in the plurality of slots in the mitigation queue.

10. A method comprising:

calculating, by a memory device, a mitigation threshold value;

storing, by a mitigation queue in the memory device, data associated with usage-based disturbances of the memory device;

updating the mitigation queue based on received aggressor row addresses; and setting a plurality of bits in the mitigation queue representing whether victim rows proximate an aggressor row need to be mitigated based on at least the mitigation threshold and the plurality of bits.

11. The method of claim 10, further comprising calculating a total mitigation pump pair (TMPP) value in the mitigation queue based on the plurality of bits representing whether victim rows proximate an aggressor row need to be mitigated.

12. The method of claim 10, wherein the plurality of bits representing whether victim rows proximate an aggressor row need to be mitigated include:

a first bit value that represents a pair of victim rows that are adjacent to the aggressor row; and a second bit value that represents a pair of victim rows that have at least one intervening row between the victim rows and the aggressor row.

13. The method of claim 12, wherein the first bit value indicates whether zero or one pump pair is required to mitigate the pair of victim rows adjacent to the aggressor row, and wherein the second bit value indicates whether zero or one pump pair is required to mitigate the pair of victim rows that have at least one intervening row between the pair of victim rows and the aggressor row.

14. The method of claim 10, wherein the mitigation queue operates in a First-In, First-Out (FIFO) manner with a plurality of slots, wherein each slot in the FIFO queue stores an address of at least one aggressor row and at least one bit that represents at least one row proximate the at least one aggressor row that needs mitigation.

15. The method of claim 10, further comprising:

generating an alert when a plurality of slots in the mitigation queue are occupied by aggressor row addresses; and initiating a mitigation activity responsive to the alert, wherein the mitigation activity includes mitigating at least a portion of the aggressor rows identified in the plurality of slots in the mitigation queue.

16. An apparatus comprising:

a mitigation threshold calculator configured to calculate a mitigation threshold value; and a mitigation controller configured to:

store data in a mitigation queue associated with usage-based disturbances of a memory device, the data associated with usage-based disturbances comprising aggressor row addresses and bits representing rows of the memory device proximate each aggressor row that need mitigation;

calculate a total mitigation pump pair (TMPP) value in a mitigation queue based on the bits representing rows proximate each aggressor row that need mitigation; and initiate usage-based disturbance mitigation for at least a portion of the rows of the memory device when the TMPP value exceeds the mitigation threshold value.

17. The apparatus of claim 16, wherein the bits representing rows of the memory device proximate each aggressor row that need mitigation include:

a first bit value that represents a pair of victim rows that are adjacent to the aggressor row; and a second bit value that represents a pair of victim rows that have at least one intervening row between the victim rows and the aggressor row.

18. The apparatus of claim 17, wherein the first bit value indicates whether zero or one pump pair is required to mitigate the pair of victim rows adjacent to the aggressor row, and wherein the second bit value indicates whether zero or one pump pair is required to mitigate the pair of victim rows that have at least one intervening row between the pair of victim rows and the aggressor row.

19. The apparatus of claim 16, wherein the mitigation threshold value is a dynamic mitigation threshold value, and wherein the mitigation threshold calculator calculates the dynamic mitigation threshold value based on an estimated mitigation delay associated with adding a new entry to the mitigation queue.

20. The apparatus of claim 16, wherein the mitigation queue is a First-In, First-Out (FIFO) queue with a plurality of slots, and wherein each slot of the FIFO queue stores at least one aggressor row address and at least one bit that represents at least one row proximate the at least one aggressor row that needs mitigation.

* * * * *